United States Patent
Nagahara (10) Patent No.: US 7,440,077 B2
(45) Date of Patent: Oct. 21, 2008

(54) EXPOSURE APPARATUS

(75) Inventor: Seiji Nagahara, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 289 days.

(21) Appl. No.: 11/324,290

(22) Filed: Jan. 4, 2006

(65) Prior Publication Data
US 2006/0152695 A1    Jul. 13, 2006

(30) Foreign Application Priority Data
Jan. 13, 2005    (JP)    ............... 2005-005858

(51) Int. Cl.
*G03B 27/52* (2006.01)
*G03B 27/42* (2006.01)
(52) U.S. Cl. .......................... 355/30; 355/53
(58) Field of Classification Search .................. 355/30, 355/53; 423/235, 242.1; 422/5
See application file for complete search history.

(56) References Cited
U.S. PATENT DOCUMENTS 5,434,644 A * 7/1995 Kitano et al. ................. 355/30
6,333,003 B1 * 12/2001 Katano et al. ................. 422/4
6,356,338 B2 * 3/2002 Arakawa ...................... 355/30
6,762,820 B2 * 7/2004 Udagawa et al. ............. 355/30
6,924,877 B2 * 8/2005 Nakano et al. ............... 355/30
2006/0066824 A1 * 3/2006 Knappe et al. ............... 355/30
2006/0156927 A1   7/2006 Udagawa et al.

FOREIGN PATENT DOCUMENTS

EP         0 879 997          11/1998
JP         2000-058433        2/2000
WO         WO 2004/099678     11/2004
WO         WO 2004/108252     12/2004

* cited by examiner

*Primary Examiner*—Diane I. Lee
*Assistant Examiner*—Steven H Whitesell-Gordo
(74) *Attorney, Agent, or Firm*—Young & Thompson (57) ABSTRACT

The exposure apparatus of the invention includes a chamber 1 housing an exposure apparatus body 6 provided with an illumination optical system 2, a reticle 3, a projection lens 4 and a stage 5, gas supply units 7, 13, 17 and 18 that are disposed in the chamber 1 and supply gas taken in from the outside of the chamber 1 to the vicinities of the reticle 3 and stage 5 and a wet filter 10 which is disposed in the vicinity of a gas intake 8 from which the gas is supplied to the gas supply units 7, 13, 17 and 18 and forms a water film through which the gas passes.

12 Claims, 6 Drawing Sheets

EXPOSURE APPARATUS

This application is based on Japanese Patent application NO. 2005-005858, the content of which is incorporated hereinto by reference.

BACKGROUND OF THE INVENTION

1. Technical Field

The present invention relates to an exposure apparatus used in a lithographic process for producing, for example, a semiconductor chip, a liquid crystal display device or an imaging device, and, particularly to an exposure apparatus provided with a unit for preventing a reticle and optical element from being hazed.

2. Related Art

There are conventionally exposure apparatuses so devised that gas purified by passing through water reserved in a water tank is made to flow on a material to be exposed to light.

These exposure apparatuses are to avoid the invasion of undesirable components generated when the gas is irradiated with exposure light (see, for example, Japanese Laid-open patent publication NO. 2000-58433).

SUMMARY OF THE INVENTION

According to the miniaturization of minimum dimension in a process for producing a semiconductor, a progress in the wavelength of exposure light for exposure is being made towards the use of shorter wavelengths, for example, 365 nm (pressure mercury lamp), 248 nm (KrF excimer laser), 193 nm (ArF excimer laser), 157 nm ($F_2$ excimer laser) and 13 nm (EUV light source) or the like.

In a g-line (435 nm) or i-line (365 nm) lithography using a mercury lamp as a light source, a reticle is hazed and an optical system is contaminated to a relatively small extent. However, in KrF lithography used mainly at present, an optical system such as lenses and mirrors and a reticle become significantly contaminated along with an increase integrated in the number of laser pulses (that is, an increase in the amount of exposure). Now that an exposure apparatus has come to the situation where it is used for ArF lithography, the exposure apparatus is contaminated so significant that lenses and a reticle must be cleaned periodically.

In order to investigate the reason, much discussion are going on about the possibilities of a causal relationship with resist material, a causal relationship with the degree of cleanness of gas around a reticle and lenses or with the degree of cleanness of a reticle case. However, any key to the reason has not been found yet.

Analysis of various environmental factors and analysis of deposits have been made, to find that the major components of the deposits are ammonium sulfate and ammonium sulfite (see, for example, BUCUS202 and Japanese Laid-open patent publication NO. 11-111593). Attempts are being made to search the source of sulfuric acid based on this result: however, a definite source has not been found so far.

The inventor of the present invention made various tests. And he found that the reason of the contamination (namely, the contamination of the parts through which a laser passes) of these optical systems when light having a shorter wavelength is used is as follows.

Specifically, the reason of the contamination is based on the same principle as that of generation of photochemical smog: specifically, sulfur oxides $SO_x$ in gas is activated by ultraviolet rays having a short wavelength and reacted with water in the gas to generate sulfuric acid or sulfurous acid. This reaction scheme is given by the following chemical reaction formula.

$$SO_x + H_2O \rightarrow H_2SO_4 + \text{others} \quad \text{(chemical formula 1)}$$

Nitrogen oxides also undergo the same reaction. This reaction scheme is given by the following chemical reaction formula.

$$NO_x + H_2O \rightarrow HNO_3 + \text{others} \quad \text{(chemical formula 2)}$$

$SO_x$ is considered to be contained to some extent in the gas filled in a clean room and it is difficult to remove this $SO_x$ by conventionally introduced filters (acid alkali filters, organic filters and organic acid filters) for cleaning the atmospheric gas in an exposure apparatus. It is not considered to limit the occurrence of the phenomenon that acids are generated in the passage of ultraviolet rays in an exposure apparatus if $SO_x$ is not removed efficiently.

Sulfuric acid ($H_2SO_4$) and nitric acid ($HNO_3$) thus produced are deposited on or adsorbed to an optical system and a reticle or pellicle. When these deposited or adsorbed materials undergo a neutralization reaction with amine present in the gas, salts are formed. This reaction scheme is given by the following chemical reaction formula.

$$H_2SO_4 + 2NH_3 \rightarrow (NH_4)_2SO_4 \quad \text{(chemical formula 3)}$$

$$HNO_3 + NH_3 \rightarrow NH_4NO_3 \quad \text{(chemical formula 4)}$$

If these salts are produced at the places where ultraviolet rays pass and the acids are generated, light is scattered and reflected because the produced salts are crystalline. This drops the transmittance of optical systems and reticles and therefore, the sensitivity of a resist to exposure to light is changed day by day in mass production of semiconductors and also, light scattering occurs in an exposure apparatus, which is a source of generation of a flare. This results in a reduction in the contrast of a pattern reaching the resist, which also deteriorates the form of the resist.

Because ammonia can be removed by a base filter, it is considered to prevent the generation of these salts by such a filter. However, if, for example, a reticle coated with acids is taken out of the exposure apparatus during exposure to light, these acids react with amine in the gas there to precipitate salts. Namely, it is most effective to prevent the generation of these acids beforehand to decrease hazing of these optical system and reticle.

There is the conventionally proposed model of theory that substances floated in the atmospheric gas promote the growth of a defect around fine residual materials as a core on the surface of a substrate activated by ultraviolet light. However, an experiment made by the inventor of the present invention shows that acids are generated in the gas along the path through which light passes during exposure to light and adsorbed to and deposited on an optical system or reticle. Then, it is considered that the reaction (chemical formulae 3 and 4) run to form salts from these acids is due to a neutralization reaction which naturally takes place in the passage of ultraviolet rays whether the substrate is in the stage during exposure or after exposure, rather than that the reaction takes place on the substrate surface activated by irradiation with light.

The inventor of the present invention has found that it is effective to reduce $SO_x$ or $NO_x$ which are the causes of the generation of these acids, in the passage of ultraviolet rays for the purpose of solving these problems.

The effect of removing $SO_x$ or $NO_x$ is not sufficiently obtained using only chemical filters that are conventionally used and also these chemical filters tend to be broken when they are used for a long time. Also, in the case of a water filter as disclosed in Patent Reference 1, a large amount of gas is made to pass through water reserved in a water tank and therefore, a large amount of air cells is generated, with the result that it is difficult to obtain desired gas flow rate because of a large loss of gas due to these air cells. Also, though it is necessary to circulate water to keep the purity of water, a large amount of water is required because the water in the water tank is replaced with freshwater, the equipment is inevitably large-scaled and there is also the case where circumferential humidity is made excessively higher.

According to the present invention, there is provided an exposure apparatus including: a chamber housing an exposure apparatus body having an illumination optical system, a reticle, a projection lens and a stage; a first gas supply unit which is disposed in the chamber and supplies gas taken in from the outside of the chamber to the vicinities of the reticle and stage; and a wet filter that is disposed upstream side of the first gas supply unit and used by wetting a filter body with water.

According to the present invention, there is provided an exposure apparatus including: a chamber housing an exposure apparatus body having an illumination optical system, a reticle, a projection lens and a stage; a first gas supply unit that is disposed in the chamber and supplies gas taken in from the outside of the chamber to the vicinities of the reticle and stage; and a wet filter that is disposed upstream side of the first gas supply unit and used by forming a water film through which the gas passes.

In the exposure apparatus according to the first aspect of the present invention, gas is incorporated into the chamber of the exposure apparatus through the wet filter including a wetted filter body formed in the gas passage. Oxides in the gas are thereby removed by wet water while the gas passes through the wet filter. It is therefore possible to prevent the exposure apparatus body from being mixed into with these oxides and to decrease the contamination of lenses and reticle, thereby reducing frequencies of the generation of hazes and defects of these lenses and reticle, whereby frequencies of cleaning of a reticle and wiping cleaning of lenses can be decreased.

In the exposure apparatus according to the second aspect of the present invention, gas is incorporated into the chamber of the exposure apparatus through the wet filter provided with a water film formed in the gas passage. Oxides in the gas are thereby removed while the gas passes through the water film. It is therefore possible to prevent the exposure apparatus body from being mixed into with these oxides and to decrease the contamination of lenses and reticle, thereby reducing frequencies of the generation of hazes and defects of these lenses and reticle, whereby frequencies of cleaning of a reticle and wiping cleaning of lenses can be decreased.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention will be explained with reference to the drawings hereinafter.

Figure 1:
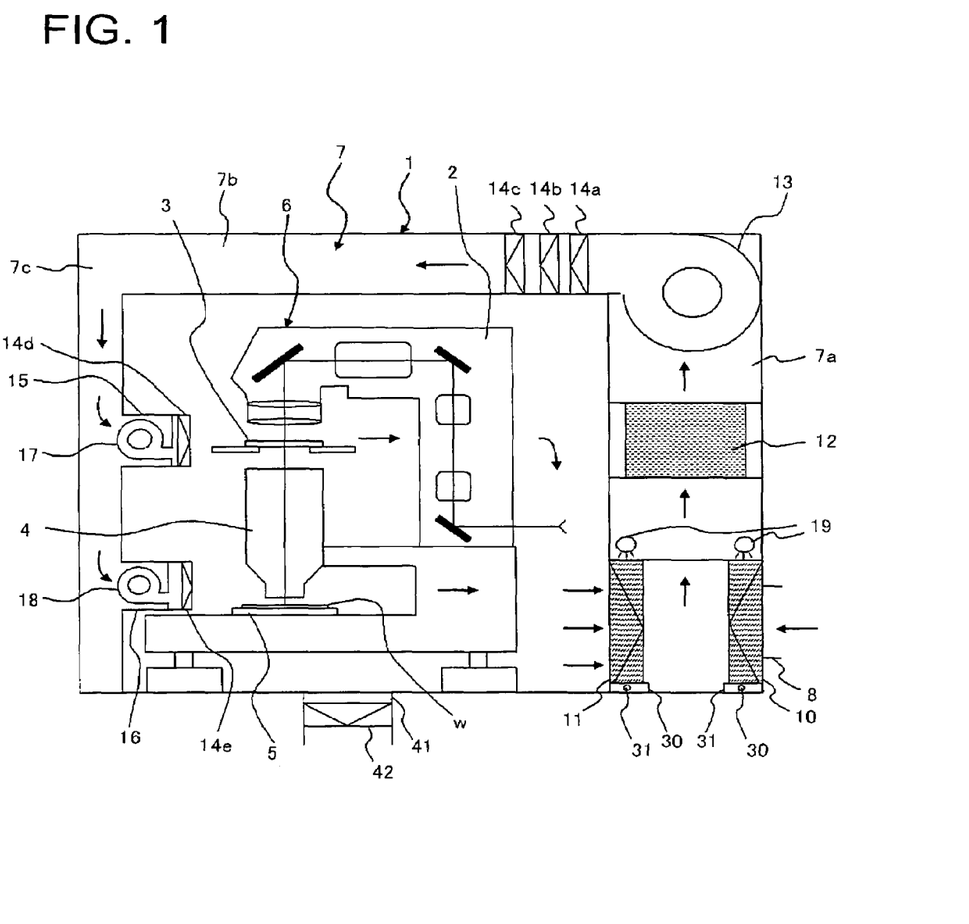
FIG. 1 is a schematic structural view of an exposure apparatus according to a first embodiment.

The exposure apparatus according to a first aspect of the present invention includes: a chamber 1 housing an exposure apparatus body 6 having an illumination optical system 2, a reticle 3, a projection lens 4 and a stage 5; first gas supply units 7, 13, 17 and 18 which are disposed in the chamber 1 and supply gas taken in from the outside of the chamber 1 to the vicinities of the reticle 3 and stage 5; and a wet filter 10 which is disposed upstream of the first gas supply units and used by wetting the body 20 thereof with water.

The exposure apparatus according to a second aspect of the present invention includes: a chamber 1 housing an exposure apparatus body 6 having an illumination optical system 2, a reticle 3, a projection lens 4 and a stage 5; gas supply units 7, 13, 17 and 18 that are disposed in the chamber 1 and supply gas taken in from the outside of the chamber 1 to the vicinities of the reticle 3 and stage 5; and a wet filter 10 which is disposed upstream side of the first gas supply units and used by forming a water-film 21 through which the gas passes.

FIG. 1 is a schematic structural view of an exposure apparatus according to a first embodiment. In FIG. 1, the exposure apparatus body 6 provided with the illumination optical system 2, the reticle 3, the projection lens 4 and the stage 5 is disposed in the chamber 1. The circumstance around the exposure apparatus body 6 is kept constant.

In the exposure apparatus body 6, exposure light emitted from a light source (not shown) is made into a given beam by the illumination optical system 2, then illuminates the reticle 3 to form an image of a circuit pattern on a wafer W placed on the stage 5 through a projection lens 4 and sensitizes a resist applied to the surface of the wafer W.

A gas passage 7 that consists of a right-side passage 7a, an upside passage 7b, a left-side passage 7c is formed on the outside periphery of the chamber 1. A introduction-side wet filter 10 communicated with the vicinity of a gas intake 8 that introduces the gas from a clean room (not shown) and a return-side wet filter 11 that takes in the gas returned from the exposure apparatus body 6 are disposed at the lower end portion of the right-side passage 7a. On the upper side (downstream) of these wet filters 10 and 11, a temperature and humidity controller 12 is disposed. A first air blower 13 is disposed at the downstream of the controller 12 and dust collecting filters 14a, 14b and 14c are disposed downstream of the outlet of the air blower 13. In the left-side passage 7c, gas supply ports 15 and 16 that are opened in the vicinities of the reticle 3 and the stage 5. A second air blower 17 and a third air blower 18 are disposed at these gas supply ports 15 and 16 respectively and dust collecting filters 14d and 14e are disposed at each air blowing port.

As these dust collecting filters 14a to 14e, optional ones are selected from those having known structures as exemplified below.

(a) A chemical filter for acid gas removal (corresponding to $SO_x$ and $NO_x$) constituted of a filter material obtained in the following manner: activated carbon using a coconut husk as a base material is impregnated with chemicals and surface-treated.

(b) A titanium oxide photocatalyst filter that decomposes organic materials or acid gases ($NO_x$, $SO_x$) when irradiated with ultraviolet rays. The light source may be a bactericidal lamp or an ultraviolet lamp.

(c) A filter obtained by coating a durable fluorine resin with titanium oxide.

(d) A filter obtained by coating three-dimensional Si/SiC porous ceramics with a photocatalyst (titanium oxide).

(e) A filter obtained by applying titanium oxide (photocatalyst) to the surface of a glass cloth mesh impregnated with PTFE (polytetrafluoroethylene).

(f) A bag filter (calcium hydroxide and activated carbon are poured)+catalyst (Ti—V type honeycomb type).

(g) An alkaline gas removing filter.

(h) An organic HEPA filter.

(i) An organic gas removing filter.

Next, each structure of the introduction-side wet filter 10 and the return-side wet filter 11 will be explained.

These wet filters 10 and 11 serves to remove gaseous contaminants constituted of oxides such as $SO_x$ and $NO_x$ by micronizing water droplets to a size of 0.3 μm or less by sprinkling, spraying or atomizing water and by passing the gas through the micronized water droplets to make these micronized water droplets adsorb these contaminants.

Figure 2:
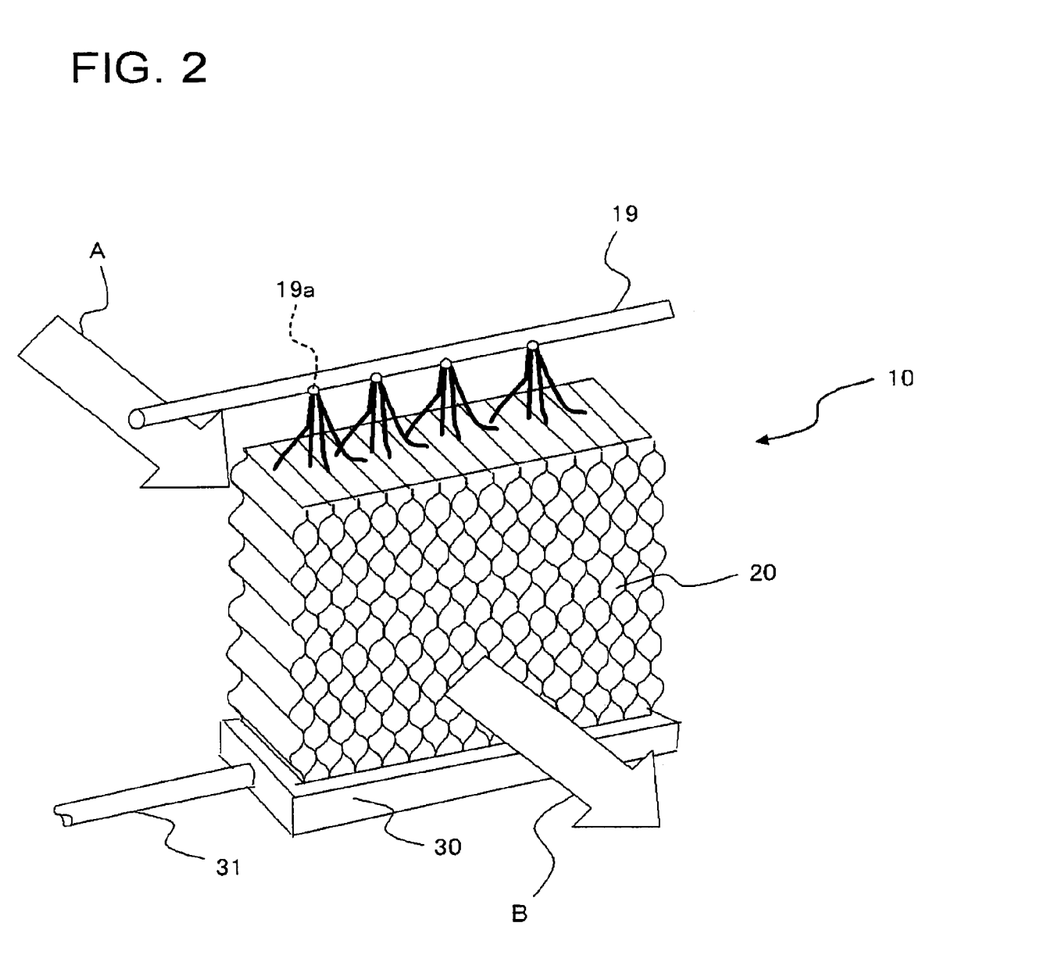
FIG. 2 is a perspective view showing a first structural example of a wet filter.

FIG. 2 is a perspective view showing a first structural example of a wet filter. As shown in FIG. 2, a jetting nozzle 19 (water jetting units) having plural jetting holes 19a is disposed on the upper portion of a filter body 20 having a honeycomb structure and a water discharge pan 30 and a water discharge pipe 31 for discharging water from the water discharge pan 30 are disposed on the lower portion of the filter body 20. Water is flowed down along the filter body 20 to form a water film 21 (see FIG. 4A) on both sides of the filter body 20 by jetting water towards the filter body 20 from the jetting holes 19a. Also, water is penetrated into the filter body 20 and also enters into holes of the honeycomb structure to wet the filter body 20. The above oxides are removed while the gas is passed through the water film 21 and the wetted filter body 20 from the direction of the arrow A towards the direction of the arrow B and then dumped as wastes from the lower water discharge pipe 31. Here, wetting effect is more improved by forming holes through the wall surface of the honeycomb structure.

Figure 3:
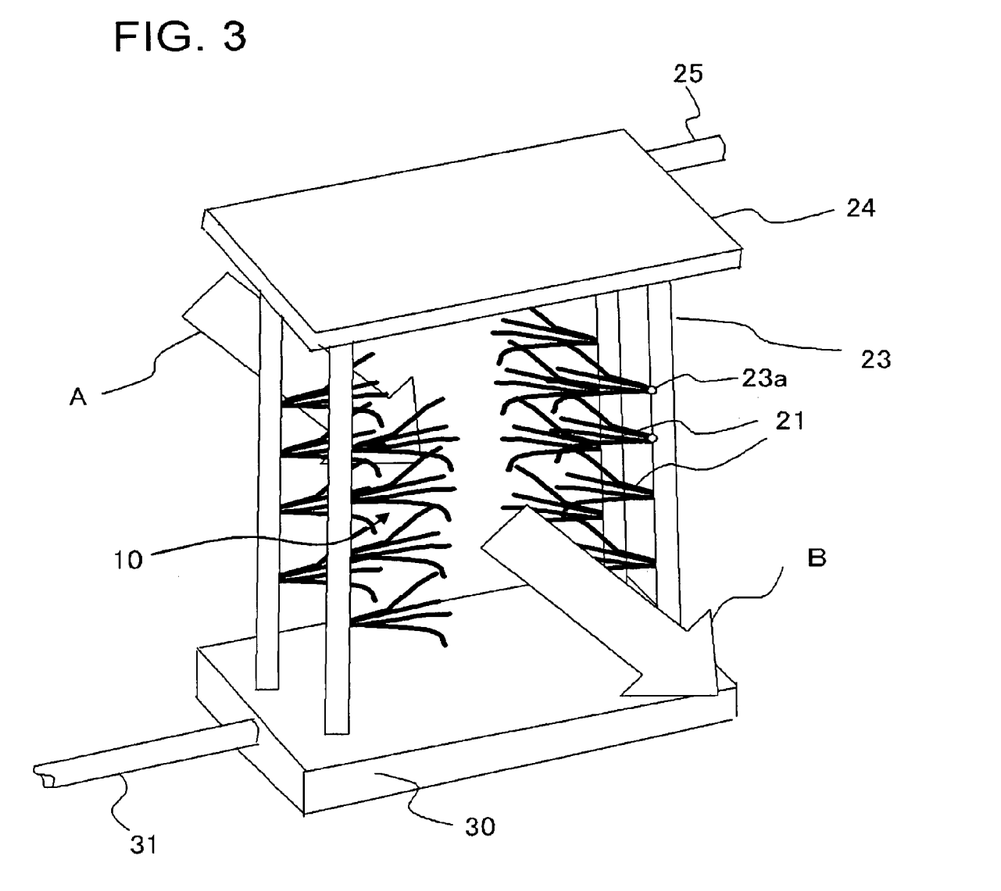
FIG. 3 is a perspective view showing a second structural example of a wet filter.

FIG. 3 is a perspective view showing a second structural example of a wet filter. In FIG. 3, two jetting nozzles 23 with jetting holes 23a are vertically installed on each of the right and left sides. A water supply tank 24 is disposed on the top of the jetting nozzle 23 (water jetting unit) and a water discharge pan 30 and a water discharge pipe 31 are disposed on the lower portion of the jetting nozzle 23.

Water is supplied to the water supply tank 24 from the water supply pipe 25, and water in the water supply tank 24 is supplied to each jetting nozzle 23 and jetted from the jetting holes 23a towards the lateral sides to form an atomized water film 21 between the right and left side jetting nozzles 23 and 23. In this second structural example, a filter body of the wet filter 10 is constituted only of the water film 21. The above oxides are removed while the gas is transmitted through the water film 21 from the direction of the arrow A towards the direction B and dumped as wastes from the lower water discharge pipe 31.

Figure 4A:
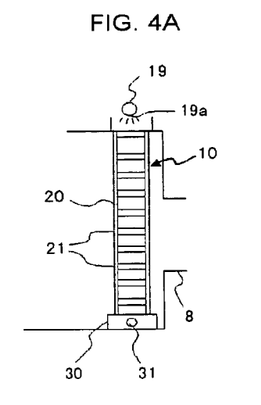
FIGS. 4A to 4E are side views showing a modification of a wet filter.
Figure 4B:
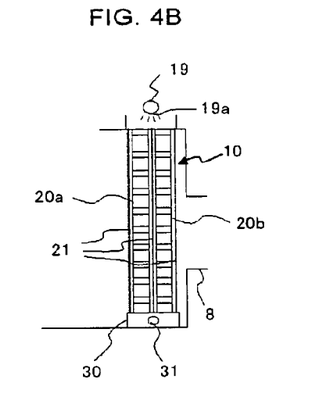

FIG. 4A shows a side view of a first structural example and FIGS. 4B to 4A show other structural examples of the wet filters 10 and 11.

(a) This is a side view of the first structural example as shown in FIG. 2, wherein a water film 21 which falls and flows along both sides of the filter body 20 having a honeycomb structure is formed.

(b) Two filter bodies 20a and 20b each having a honeycomb structure are slanted at the honeycomb part to form a slant honeycomb structure. These filter bodies 20a and 20b are placed opposite to each other and similarly to (a), water is jetted from a jetting holes 19a to form a water film 21 along both surfaces of the filter bodies 20a and 20b. This structure increases the number of water films 21 and the holes of the filter bodies 20a and 20b are made smaller, which more improves the filtering effect.

Figure 4C:
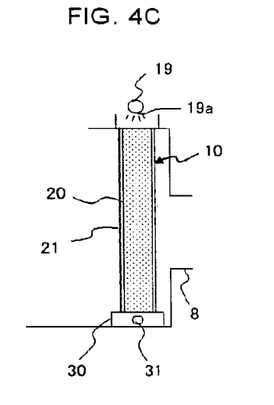

(c) A porous ceramic or inorganic fiber filter body 20 is used in place of the honeycomb structure. Other structures are the same as (a) except for this.

Figure 4D:
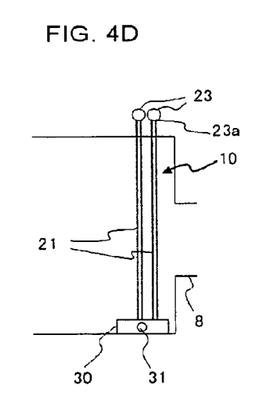

(d) A modification of the above second structural example, wherein two jetting nozzles 23 are disposed on the top and water is jetted downward from the jetting holes 23a to form a water film that falls and flows downward. The thickness of the water film 21 may be increased by increasing the number of the jetting nozzles 23.

Figure 4E:
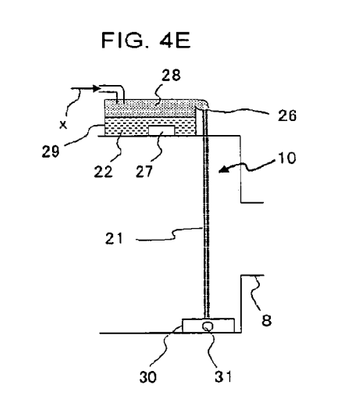

(e) Mists 28 are generated by a ultrasonic transducer 27 placed in a container 29 filled with water 22 and air is supplied in the direction of the arrow X to thereby jet mists from a jetting hole 26, thereby forming a mist-like water film 21 in the vicinity of an air intake 8. In this structural example, the filter body of the wet filter 10 is constituted only of the water film 21.

In the above structural examples (a), (b) and (c), the inside of the filter body 20 is wetted by the water that penetrates into the filter body 20 in place of or together with the water film 21 and the above oxides are removed by this wetting water.

As the water used for the above wet filters 10 and 11, purified water or nonvolatile aqueous alkali solution (long-chain ammonia) is used.

Next, the action of the above exposure apparatus will be explained.

During an exposure operation of the exposure apparatus, the first to third air blowers 13, 17 and 18 are made to work to take in the air involved in the clean room from the gas intake 8 through the wet filter 10. As shown in FIGS. 4A to 4E, water or mists are continuously jetted from the jetting holes 19a 23a 26 to form the water film 21 inside of the gas intake 8, thereby constituting the wet filter 10. The gas introduced from the gas intake 8 is transmitted through the water film 21 of the wet filter 10, while sulfur oxides ($SO_x$) and nitrogen oxides ($NO_x$) are removed based on the principle of the above reaction formulae (chemical formulae 1 and 2), fall down together with the water film 21 and are discharged from the water discharge pipe 31 through the water discharge pan 30. The gas almost cleaned by the above process enters the temperature and humidity controller 12, where it is adjusted to optimal temperature and humidity. Then, the gas is made to pass through the first to fifth dust collecting filters 14a, 14b, 14c, 14d and 14e, while acid gases such as $SO_x$ and $NO_x$ left unremoved in the gas are completely removed, and then supplied to the vicinities of the reticle 3 and the stage 5 from the gas supply ports 15 and 16.

The gas discharged from the exposure apparatus body 6 is sucked into the return-side wet filter 11, where acid gases are again removed, and is recycled as mentioned above.

As mentioned above, the measure taken to introduce the gas into the chamber 1 through the wet filter 10 prevents the exposure apparatus 6 from being mixed into these oxides into the exposure apparatus 6 from the outside, so that the illumination optical system 2, the projection lens 4 and the reticle 3 are less contaminated, making it possible to decrease frequencies of the generation of hazes and defects and therefore frequencies of cleaning of a reticle 3 and wiping cleaning of lenses can be decreased. Because the cleaning of the reticle 3 leads to a variation in the dimension of the pattern, there is a limitation to the number of cleanings. It is a large loss to the production cost to carry out the cleaning of the expensive reticle 3 which renders the life span of the reticle shorter. In this embodiment, on the contrary, the number of cleanings can be reduced, thereby making it possible to decrease the production cost of the device.

Figure 5:
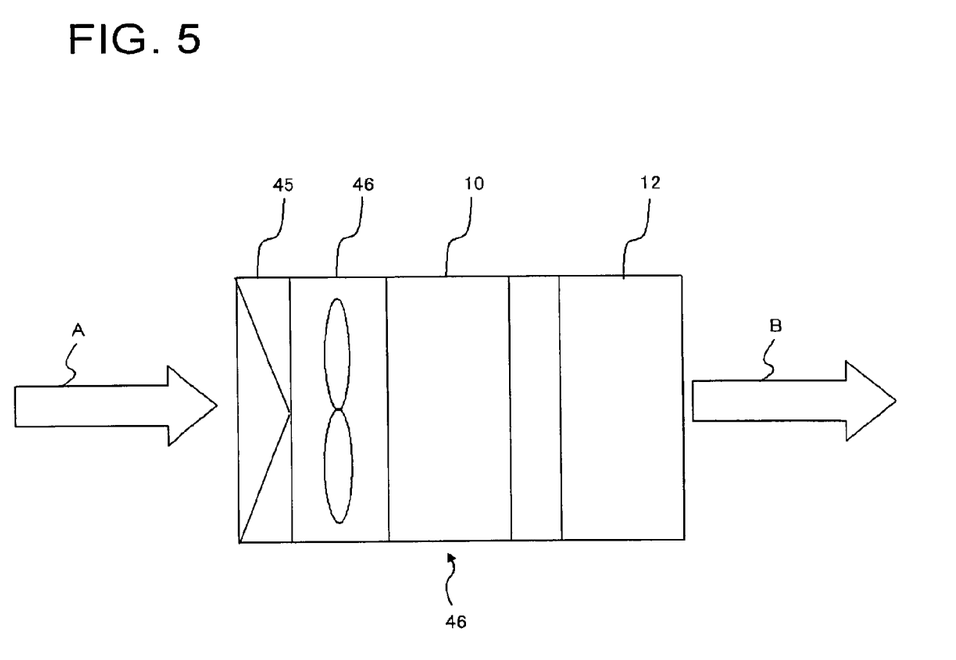
FIG. 5 is a side view a filter unit disposed outside of a chamber.

FIG. 5 is a view of a wet filter obtained by unitizing the introduction side wet filter 10 and by disposing the filter outside of a chamber. Specifically, a dust collecting filter 45 and an air blower 46 are disposed in front of the wet filter 10 and a temperature and humidity controller 12 is disposed behind the wet filter 10. These parts are united into one filter unit, which is connected to the chamber 1 through a duct (not shown). The chamber 1 can be small-sized by disposing the filter unit outside of the chamber 1 in this manner. If the air blower 46 is disposed in front of the wet filter 10, pressure loss in the wet filter 46 can be suppressed.

Figure 6:
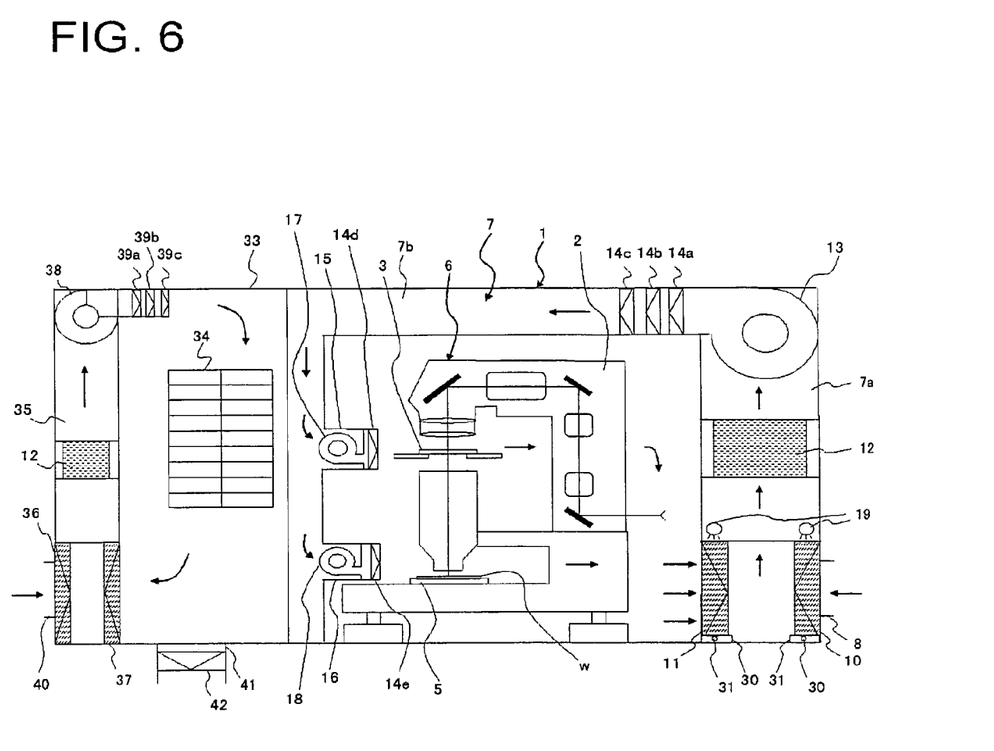
FIG. 6 is a schematic structural view of an exposure apparatus according to a second embodiment.

FIG. 6 shows a second embodiment in which the reticle stocker room is independently disposed separately from the exposure part.

Specifically, a reticle stocker room 33 independent of the chamber 1 for storing a reticle stocker 34 is disposed at one side (outside) of the chamber 1. An introduction-side wet filter 36 and a return-side wet filter 37 like the wet filters 10 and 11 are disposed on the lower end portion of a gas passage (second gas supply unit) 35 arranged in the reticle stocker 33 and an air blower (second gas supply unit) 38 and dust collecting filters 39a, 39b and 39c are disposed on the upper portion (downstream) of the wet filters 36 and 37.

The gas that is introduced from a gas intake 40 and cleaned through the wet filter 36 passes through the dust collecting filters 39a, 39b and 39c where acid gases including $SO_x$ and $NO_x$ remaining in the gas are completely removed. The gas then flows in the direction of the reticle stocker 34, is then sucked in the return-side wet filter 37, where the acid gases are again removed and is recycled as mentioned above.

In the present embodiment, the apparatus is so devised that the reticle stocker room 33 is a room independent of the exposure room (in the chamber 1) and the gas separated that of the exposure apparatus body 6 is made to flow, and therefore acids generated during exposure is prevented from being accumulated on the reticle.

Also, in this second embodiment 2, the wet filters 36 and 37 may be installed as a filter unit outside of the chamber 1 and the reticle stocker room 33 as shown in FIG. 5. The reticle stocker room 33 may be installed either adjacent to or apart from the chamber 1.

Also, as shown in FIGS. 1 and 6, a discharge port 41 with a dust collecting filter 42 may be disposed at an appropriate place in the lower portion of the chamber 1 or the reticle stocker room 33 to discharge the gas.

It is apparent that the present invention is not limited to the above embodiment, which may be modified and changed without departing from the scope and spirit of the invention.

What is claimed is:

1. An exposure apparatus comprising:
   a chamber housing an exposure apparatus body having an illumination optical system, a reticle, a projection lens and a stage;
   a first gas supply unit which is disposed in said chamber and supplies gas taken in from the outside of said chamber to the vicinities of said reticle and stage; and
   a wet filter which is disposed upstream side of said first gas supply unit and used by forming a water film through which the gas passes, wherein said wet filter has a structure in which a filter body comprises a porous ceramic and water jetted from a water jetting unit disposed on the upper portion of said filter body is supplied to said filter body.

2. The exposure apparatus according to claim 1, the exposure apparatus further comprising:
   a reticle stocker room independent of said chamber; and
   a second gas supply unit which is disposed in said reticle stocker room for supplying the gas introduced from outside of the room to a reticle stocker,
   a wet filter which is disposed upstream side of the said second gas supply unit.

3. The exposure apparatus according to claim 1, the exposure apparatus further comprising a dust collecting filter,
   wherein the dust collecting filter is disposed together with said wet filter in a gas passage of said first gas supply unit.

4. The exposure apparatus according to claim 3,
   wherein said dust collecting filter comprises one or more filters selected from the group consisting of a chemical filter for acid gas removal, a filter for alkaline gas removal, a filter for organic gas removal and a photocatalyst filter utilizing titanium oxide or a Ti-V type thin film.

5. The exposure apparatus according to claim 3, the exposure apparatus further comprising a temperature and humidity controller which controls the temperature and humidity of the gas and is disposed downstream of said wet filter.

6. The exposure apparatus according to claim 5, wherein the dust collecting filter, an air blower, said wet filter and said temperature and humidity controller are arranged in this order to constitute a filter unit and said filter unit is connected to said chamber or a reticle stocker room.

7. An exposure apparatus comprising:
   a chamber housing an exposure apparatus body having an illumination optical system, a reticle, a projection lens and a stage;
   a first gas supply unit which is disposed in said chamber and supplies gas taken in from the outside of said chamber to the vicinities of said reticle and stage; and
   a wet filter which is disposed upstream side of said first gas supply unit and used by wetting a filter body with water, wherein said wet filter has a structure in which said filter body comprises a porous ceramic and water jetted from a water jetting unit disposed on the upper portion of said filter body is supplied to said filter body.

8. The exposure apparatus according to claim 7, the exposure apparatus further comprising:
   a reticle stocker room independent of said chamber; and
   a second gas supply unit which is disposed in said reticle stocker room for supplying the gas introduced from outside of the room to a reticle stocker,
   a wet filter which is disposed upstream side of the said second gas supply unit.

9. The exposure apparatus according to claim 7, the exposure apparatus further comprising a dust collecting filter, wherein the dust collecting filter is disposed together with said wet filter in a gas passage of said first gas supply unit.

10. The exposure apparatus according to claim 9,
wherein said dust collecting filter comprises one or more filters selected from the group consisting of a chemical filter for acid gas removal, a filter for alkaline gas removal, a filter for organic gas removal and a photocatalyst filter utilizing titanium oxide or a Ti-V type thin film.

11. The exposure apparatus according to claim 9, the exposure apparatus further comprising a temperature and humidity controller which controls the temperature and humidity of the gas and is disposed downstream of said wet filter.

12. The exposure apparatus according to claim 11, wherein the dust collecting filter, an air blower, said wet filter and said temperature and humidity controller are arranged in this order to constitute a filter unit and said filter unit is connected to said chamber or a reticle stocker room.

* * * * *